(12) United States Patent
Wang

(10) Patent No.: US 6,702,002 B2
(45) Date of Patent: Mar. 9, 2004

(54) HYDRONIC PUMP TYPE HEAT RADIATOR

(75) Inventor: Chin-Wen Wang, 4F-3, No. 9, Hsin Fu I St., Ping Jen City, Tao Yuan Hsien (TW)

(73) Assignees: Chin-Wen Wang, Tao Yuan Hsien (TW); Pei-Choa Wang, Tao Yuan Hsien (TW); Ching Chung Wang, Tao Yuan Hsien (TW)

( * ) Notice: Subject to any disclaimer, the term of this patent is extended or adjusted under 35 U.S.C. 154(b) by 123 days.

(21) Appl. No.: 10/159,037

(22) Filed: Jun. 3, 2002

(65) Prior Publication Data

US 2003/0221815 A1 Dec. 4, 2003

(51) Int. Cl.⁷ .................................................. F28F 7/00
(52) U.S. Cl. ................. 165/80.3; 165/80.4; 165/104.33; 361/699; 174/15.1
(58) Field of Search ........................... 165/80.3, 104.33, 165/80.4, 185; 361/699, 700; 174/15.1; 257/714, 715, 716

(56) References Cited

U.S. PATENT DOCUMENTS

| | | | | |
|---|---|---|---|---|
| 3,149,666 A | * | 9/1964 | Coe ........................... 165/80.3 |
| 5,529,115 A | * | 6/1996 | Paterson ................. 165/104.33 |
| 5,729,995 A | * | 3/1998 | Tajima ................... 165/104.33 |
| 6,005,772 A | * | 12/1999 | Terao et al. ................. 361/699 |
| 6,019,167 A | * | 2/2000 | Bishop et al. ......... 165/104.33 |
| 6,315,033 B1 | * | 11/2001 | Li ........................... 165/104.33 |
| 6,439,298 B1 | * | 8/2002 | Li ........................... 165/104.33 |

\* cited by examiner

*Primary Examiner*—Terrell McKinnon
(74) *Attorney, Agent, or Firm*—Rosenberg, Klein & Lee

(57) ABSTRACT

The present invention provides a hydronic pump type heat radiator, which comprises an outer ring heat spreader, a plurality of outer heat-radiating fins, a plurality of inner heat-radiating fins, a cavity, and a pump. The outer ring heat spreader has an annular wall. The inside of the annular wall has a receiving space. The outer heat-radiating fins are disposed outside the outer ring heat spreader. The inner heat-radiating fins are disposed inside the receiving space of the outer ring heat spreader. The cavity is disposed between the inner heat-radiating fins and the outer ring heat spreader. The cavity is used to receive cooling liquid therein. The pump is properly connected to the cavity, and can drive the cooling liquid in the cavity to make circulative flow so as to quickly transfer heat source and have the heat-radiating function of compulsory flow of liquid.

7 Claims, 6 Drawing Sheets

HYDRONIC PUMP TYPE HEAT RADIATOR

FIELD OF THE INVENTION

The present invention relates to a hydronic pump type heat radiator and, more particularly, to a heat radiator, wherein outer and inner heat-radiating fins thereof are used together, and a cavity for receiving cooling liquid is also matched to achieve a better heat-radiating effect through convective characteristic of liquid and air.

BACKGROUND OF THE INVENTION

Nowadays, every aspect of lives cannot come off the range of scientific technology. Scientific progress mainly shows in the invention of computer. Especially, the influence of central processing unit (CPU) in the computer has already totally permeated personal life.

Along with quick development of the computer industry, computers have more and more powerful operational capacity, and the operational speeds of CPUs become faster and faster. Moreover, the CPUs give out more and more heat. In order to let the CPUs operate under admissible temperatures, various kinds of heat radiators having increased heat-radiating areas have been proposed to apply to electronic parts giving out more heat like the CPUs.

However, the heat-radiating function of conventional heat-radiating fins can hardly solve the heat-radiating problem of heat source generated when the CPU operates with the operational speed thereof enhanced more and more.

As shown in FIG. 1, in a conventional desktop computer, a CPU 10a generally adopts a plurality of open-end erect heat-radiating fins 11a as the heat radiator. Heat source generated by the CPU 10a in the computer is spread from a bottom face 12a to the heat-radiating fins 11a. A fan 13a is also matched to radiate out heat.

As shown in FIG. 2, a plurality of heat-radiating fins 20a are circularly distributed with a central cylinder heat spreader 21a as the center. A fan 22a is also matched to accomplish the whole heat-radiating function.

However, because the one side of the above heat-radiating fins opposite to the fan is a closed plane, the heat-radiating capacity in limited space is much restrained. Moreover, the conventional open-end heat-radiating fins are solid material, which spreads heat by means of heat conduction. Therefore, the heat-radiating speed is much slower than the speed at which heat is discharged by means of heat convection when the CPU operates. The heat-radiating efficiency thereof is thus not good enough.

Accordingly, the above heat radiators have inconvenience and drawbacks in practical use. The present invention aims to provide a heat radiator to resolve the problems in the prior art.

SUMMARY OF THE INVENTION

The primary object of the present invention is to provide a hydronic pump type heat radiator, which radiates out heat concentratedly in a closed space and also has heat-radiating function of compulsory flow of fluid so as to effectively radiate out heat in circulative way, greatly increase the heat-radiating area, and thoroughly discharge heat out of a computer, thereby increasing convenience in use and enhancing the heat-radiating efficiency.

To achieve the above object, the present invention provides a hydronic pump type heat radiator, which comprises an outer ring heat spreader having an annular wall, a plurality of outer heat-radiating fins, a plurality of inner heat-radiating fins, an annular cavity, and a pump. The inside of the annular wall has a receiving space. The outer heat-radiating fins are disposed outside the outer ring heat spreader. The inner heat-radiating fins are disposed inside the receiving space of the outer ring heat spreader. The annular cavity is disposed between the inner heat-radiating fins and the outer ring heat spreader. The annular cavity receives cooling liquid therein. The pump is connected with the annular cavity, and can drive the cooling liquid in the annular cavity to flow in circulative way to transfer heat source fast, thereby achieving the heat-radiating function of compulsory flow of liquid.

The various objects and advantages of the present invention will be more readily understood from the following detailed description when read in conjunction with the appended drawing, in which:

DETAILED DESCRIPTION OF THE PREFERRED EMBODIMENTS

Figure 1:
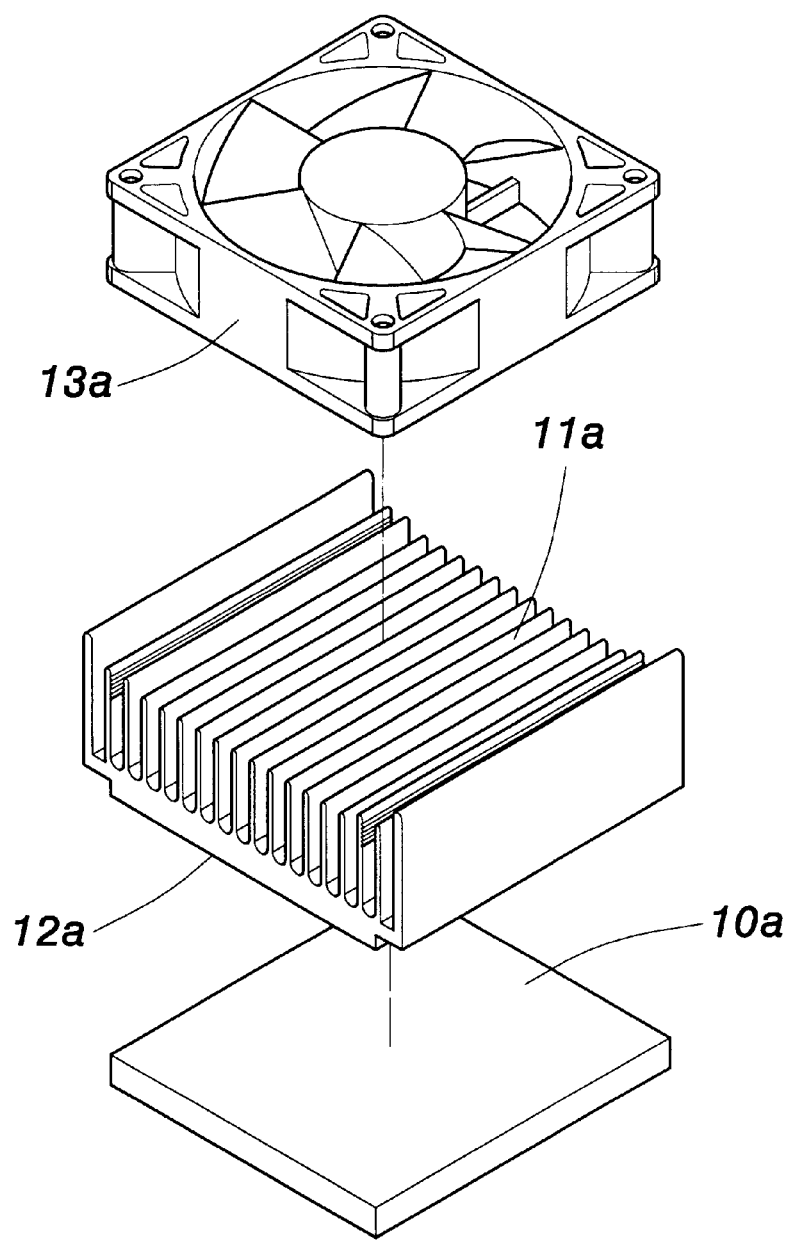
FIG. 1 is a perspective view of a heat radiator in the prior art.
Figure 2:
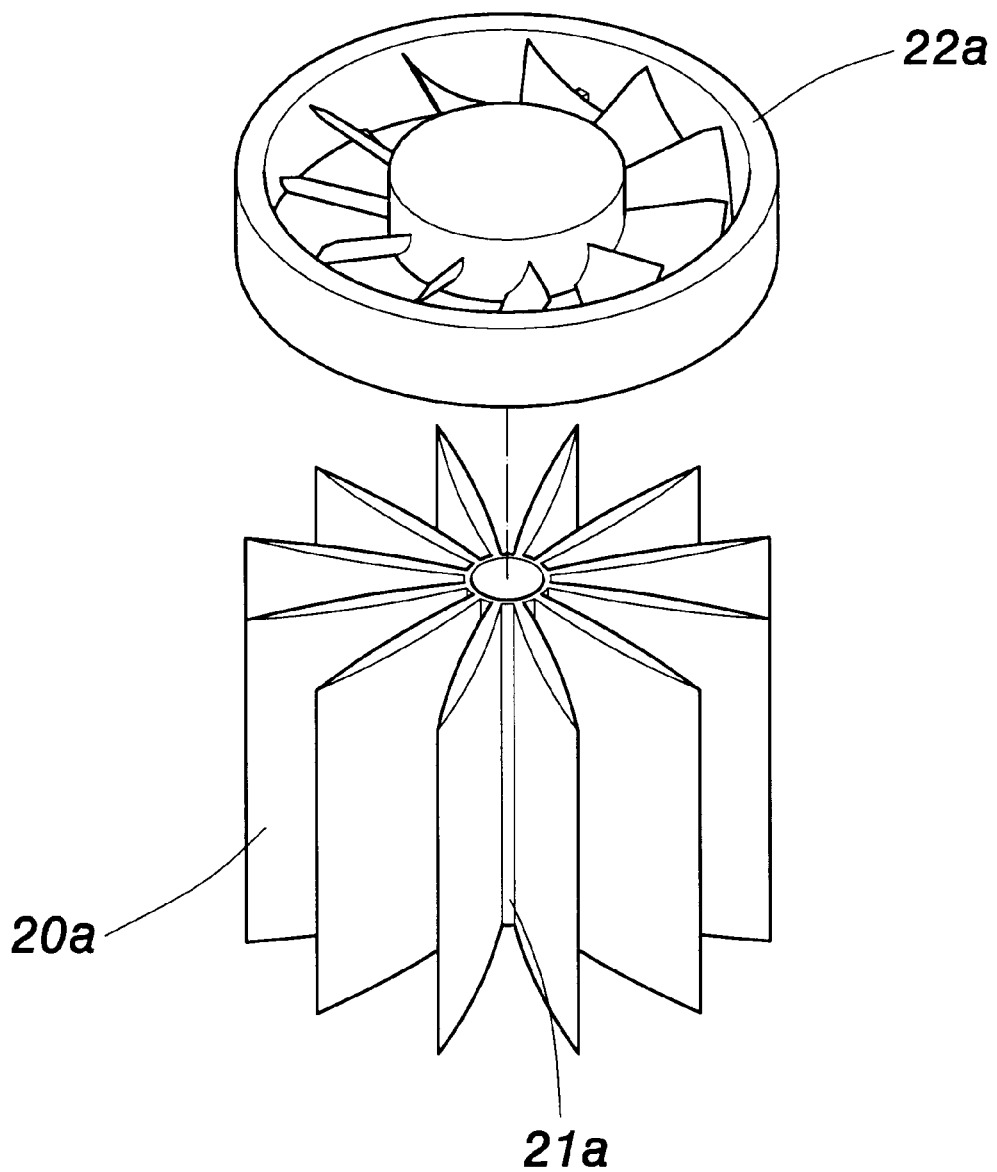
FIG. 2 is a perspective view of another kind of heat radiator in the prior art.
Figure 3:
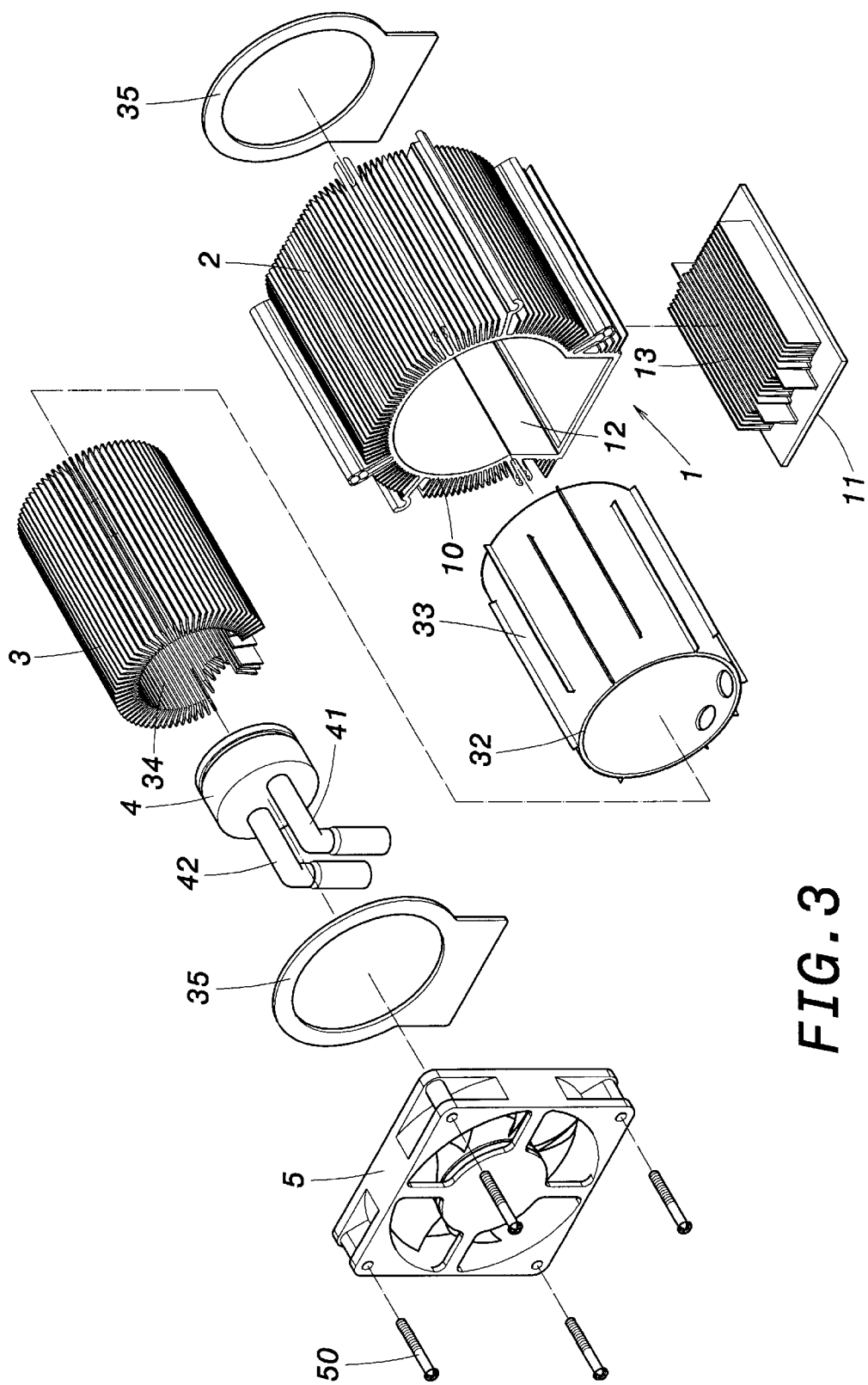
FIG. 3 is an exploded perspective view according to a first embodiment of the present invention.
Figure 4:
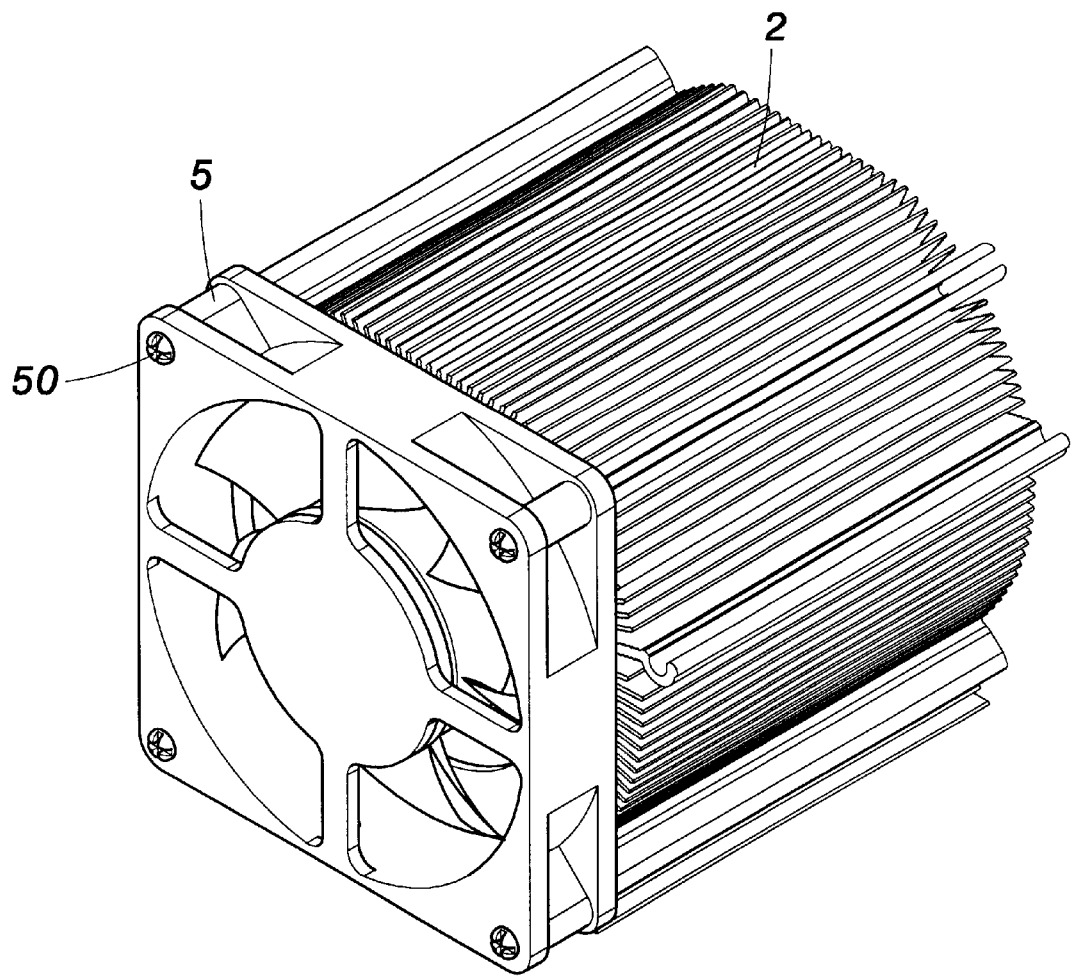
FIG. 4 is a perspective assembly view according to the first embodiment of the present invention.

As shown in FIGS. 3, 4, 5, and 6, the present invention provides a hydronic pump type heat radiator comprising an outer ring heat spreader 1, a plurality of outer heat-radiating fins 2, and a plurality of inner heat-radiating fins 3, and a pump 4, and is located above a central processing unit (CPU) 6. The inner and outer heat-radiating fins 2 and 3 are used together. Circulation of cooling liquid can be formed therein to radiate out heat source generated when the CPU 6 operates.

The outer ring heat spreader 1 is made of material of good heat conductance, and comprises an annular wall 10 and a seat bottom face 11. The annular wall 10 is formed of a cylindrical ring. The seat bottom face 11 is connected at the outside of the annular wall 10 in assembly way. The inside of the annular wall 10 and the seat bottom face 11 has a hollow receiving space 12, which penetrates to two ends of the outer ring heat spreader 1.

The outer heat-radiating fins 2 are disposed outside the outer ring heat spreader 1. The outer heat-radiating fins 2 project from the outer wall of the outer ring heat spreader 1, and radially scatter outwards. The outer heat-radiating fins 2 are made of material with good heat conductance, and are integrally formed outside the outer ring heat spreader 1, or are assembled outside the outer ring heat spreader 1. In this embodiment, the outer heat-radiating fins 2 are integrally formed at the outside of the annular wall 10 of the outer ring heat spreader 1. A plurality of bottom face heat-radiating fins 13 are disposed inside the seat bottom face 11 of the outer ring heat spreader 1.

Figure 6:
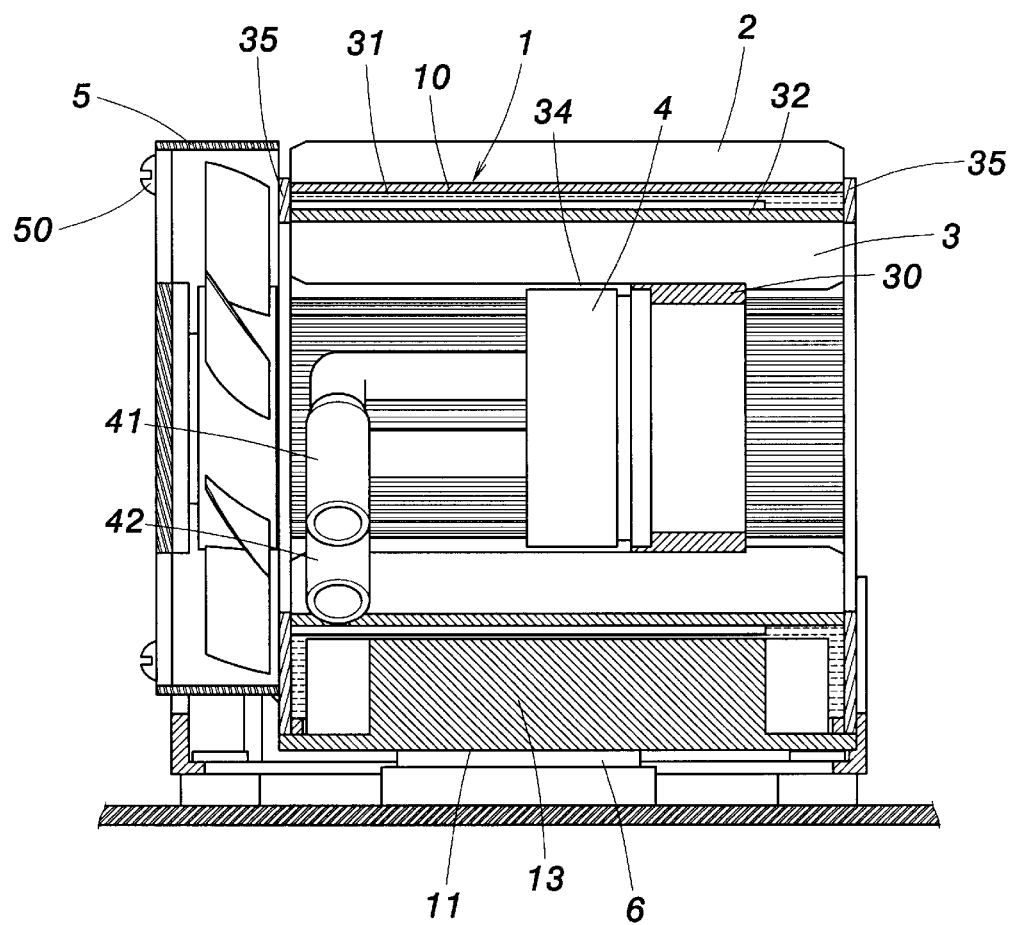
FIG. 6 is a longitudinal cross-sectional view of the present invention.

The inner heat-radiating fins 3 are disposed inside the receiving space 12 of the outer ring heat spreader 1. The inner heat-radiating fins 3 are made of material with good heat conductance, and are disposed in the outer ring heat spreader 1 in assembly way. The inner heat-radiating fins 3 are formed at the outside of an inner ring heat spreader 30 in advance (as shown in FIG. 6), and the inner ring heat spreader 30 and the inner heat-radiating fins 3 are then assembled in the receiving space 12. An annular cavity 31 can be formed between the inner heat-radiating fins 3 and the outer ring heat spreader 1. The annular cavity 31 can receive cooling liquid therein to enhance the heat-spreading and cooling functions of the heat radiator.

A deflection component 32 can be disposed inside the cavity 31. The deflection component 32 has a twisty flow passageway 33 to guide the cooling liquid in the cavity 31 to flow progressively. A predetermined space 34 can be formed in the inner heat-radiating fins 3 to facilitate installation of the pump 4. The cavity 31 has two open ends, each having a ringed cover 35. The covers 35 are fixed at two ends of the cavity 31 to close two ends of the cavity 31.

The pump 4 is included in the space 34 of the inner heat-radiating fins 3. The pump 4 is driven by a motor (not shown). The pump 4 is connected to the cavity 31 via conveyance pipes 41 and 42 to drive the cooling liquid in the cavity 31 to make circulative flow. A hydronic pump type heat radiator of the present invention is thus formed.

Figure 5:
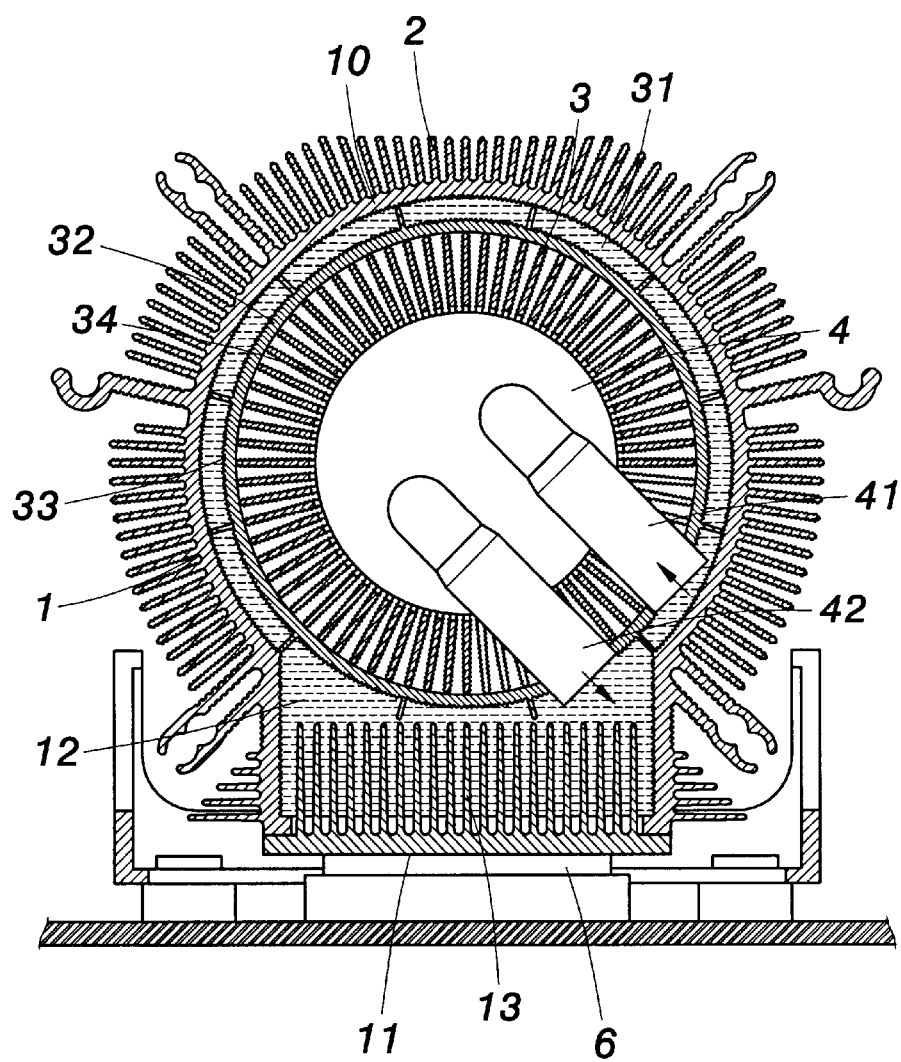
FIG. 5 is a transversal cross-sectional view of the present invention.

As shown in FIGS. 5 and 6, the seat bottom face 11 of the outer ring heat spreader 1 of the present invention can be placed on the CPU 6 to conduct heat source generated when the CPU operates to the outer ring heat spreader 1, the bottom face heat-radiating fins 13, the outer heat-radiating fins 2, and the inner heat-radiating fins 3. The present invention is characterized in that the inner and outer heat-radiating fins 2 and 3 are used together to greatly increase the heat-radiating area and enhance the heat-spreading and cooling functions. Besides, a fan 5 can be fixedly screwed to one end of the heat radiator with screws to assist in radiating out heat.

Moreover, the cavity 31 is disposed inside the outer ring heat spreader 1 to receive cooling liquid. When the heat source generated by the CPU 6 is transmitted from the outer ring heat spreader 1 to the cooling liquid, the heat source generated by the CPU 6 can be quickly transferred. Residual heat will be spread into the outer and inner heat-radiating fins 2 and 3 by means of convective circulation to achieve a better heat-radiating effect. In other words, the present invention utilizes the convective characteristic of liquid and air to achieve a better heat-radiating effect.

Additionally, the present invention can also use the pump 4 to drive the cooling liquid in the cavity 31 to make circulative flow, hence quickly transferring the heat source generated by the CPU 6. Residual heat will be spread into the outer and inner heat-radiating fins 2 and 3 by means of convective circulation to achieve a better heat-radiating effect. The present invention can radiate out heat in a closed space and has the heat-radiating function of compulsory flow of fluid to effectively radiate out heat in circulative way, greatly increase the heat-radiating area, and thoroughly discharge heat out of a computer, thereby increasing convenience in use and enhancing the heat-radiating efficiency.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A hydronic pump type heat radiator, comprising:
   an outer ring heat spreader having an annular wall, said annular wall having
      a receiving space therein;
      a plurality of outer heat-radiating fins disposed outside said outer ring heat spreader;
      a plurality of inner heat-radiating fins disposed inside said receiving space of said outer ring heat spreader;
      an annular cavity disposed between said inner heat-radiating fins and said outer ring heat spreader, said cavity being used to receive cooling liquid therein; and
      a pump connected to said cavity, said pump being used to drive the cooling liquid in said cavity to make circulative flow so as to quickly transfer heat source and have the heat-radiating function of compulsory flow of liquid.

2. The hydronic pump type heat radiator as claimed in claim 1, wherein said outer ring heat spreader has also a seat bottom face, and a plurality of bottom face heat-radiating fins are disposed at an inside of said seat bottom face of said outer ring heat spreader.

3. The hydronic pump type heat radiator as claimed in claim 1, wherein said outer heat-radiating fins project out from an outer wall of said annular wall of said outer ring heat spreader.

4. The hydronic pump type heat radiator as claimed in claim 1, wherein said inner heat-radiating fins are formed at the outside of an inner ring heat spreader, and said inner heat-radiating fins and said inner ring heat spreader are then assembled in said receiving space.

5. The hydronic pump type heat radiator as claimed in claim 1, wherein said inner heat-radiating fins has a space therein, and said pump is installed in said space.

6. The hydronic pump type heat radiator as claimed in claim 1, wherein a deflection component having a flow passageway is disposed in said cavity to guide the cooling liquid in said cavity to flow progressively.

7. The hydronic pump type heat radiator as claimed in claim 1, wherein said cavity has two open ends, each having a cover to cover the end of said cavity.

* * * * *